US008644378B2

(12) United States Patent
Liu et al.

(10) Patent No.: US 8,644,378 B2
(45) Date of Patent: Feb. 4, 2014

(54) METHOD AND APPARATUS FOR DE-SPREADING A SPREAD-SPECTRUM AUDIO/VIDEO SIGNAL

(75) Inventors: Zhibing Liu, San Jose, CA (US); Jay Liang, Los Altos, CA (US)

(73) Assignee: Synaptics Incorporated, San Jose, CA (US)

( * ) Notice: Subject to any disclaimer, the term of this patent is extended or adjusted under 35 U.S.C. 154(b) by 318 days.

(21) Appl. No.: 12/905,265

(22) Filed: Oct. 15, 2010

(65) Prior Publication Data

US 2012/0093199 A1    Apr. 19, 2012

(51) Int. Cl.
- *H04B 1/66* (2006.01)
- *H04N 7/12* (2006.01)
- *H04N 11/02* (2006.01)
- *H04N 11/04* (2006.01)

(52) U.S. Cl.
USPC ..................... 375/240.03; 375/371

(58) Field of Classification Search
USPC ............................ 375/371, 240.03
See application file for complete search history.

(56) References Cited

U.S. PATENT DOCUMENTS

| 7,088,398 B1 * | 8/2006 | Wolf et al. ................. 348/423.1 |
| 2008/0304599 A1 * | 12/2008 | Furtner ......................... 375/340 |

* cited by examiner

*Primary Examiner* — Chieh M Fan
*Assistant Examiner* — Tanmay Shah
(74) *Attorney, Agent, or Firm* — Osha Liang LLP

(57) ABSTRACT

A digital video communication device is provided. The digital video communication device includes a transmitter providing a spread-spectrum video signal including a predetermined frequency spread value and a frequency ratio and a receiver receiving the spread-spectrum video signal. The receiver includes a frequency synthesizer, a free-running clock generator configured to generate a free-running clock signal, wherein the free-running clock signal is used as a reference clock signal input to the frequency synthesizer. The receiver further includes a digital control logic circuit configured to separate the frequency ratio from the spread-spectrum video signal, and a line buffer coupled to the digital control logic circuit and the frequency synthesizer, the line buffer adjusting the frequency ratio and sending the adjusted frequency ratio to the frequency synthesizer, wherein the frequency synthesizer combines the free-running clock signal and the adjusted frequency ratio, and outputs a de-spread clock signal.

13 Claims, 4 Drawing Sheets

METHOD AND APPARATUS FOR DE-SPREADING A SPREAD-SPECTRUM AUDIO/VIDEO SIGNAL

TECHNICAL FIELD

The present disclosure relates to digital telecommunications; in particular, to reducing clock jitter in spread-spectrum digital video data processing.

DISCUSSION OF RELATED ART

Spread-spectrum techniques are methods by which a signal (e.g. an electrical, electromagnetic, or telecommunication signal) generated in a given bandwidth is deliberately spread in the frequency domain. The resulting signal has a wider bandwidth but often suffers from a poorer signal to noise ratio. In telecommunications, a typical spread-spectrum technique employs direct sequence, frequency hopping, or a hybrid of these, for multiple access and/or multiple functions. After generating and transmitting the spread-spectrum signal, a receiver receives the spread-spectrum signal and correlates the signal to retrieve the original information signal in a process known as de-spreading. One of the reasons to use spread-spectrum in telecommunications is to decrease the potential interference to other receivers while increasing the amount of privacy available to the users whose signals are being transmitted.

Spread spectrum is being adopted extensively in the video industry to reduce electromagnetic interference (EMI) and to reduce power requirements. Modern mobile devices with increasing integration of high-resolution liquid crystal display (LCD) displays, such as laptop computers, smart phones, handheld mobile devices, demand faster clock speeds and smaller devices. These devices are designed to be lightweight and inexpensive, thus, passive EMI reduction measures such as capacitors and metal shielding are not viable options.

One technique to reduce the EMI of these modern mobile devices is to use spread-spectrum clocking. Although spread-spectrum clocking provides improved active EMI reduction, spread-spectrum clocking creates additional challenges for designers. For example, when using spread-spectrum clocking there is a risk that the clock and the data will become misaligned during de-spreading. Further, when using a link symbol clock in accordance with the DisplayPort standard with spread-spectrum clocking, the amount of time required to synchronize the link symbol clock sent from the transmitter to the receiver will increase, thus creating more jitter at the receiver side.

Consequently, there is a need for a spread-spectrum clocking scheme having little to no clock jitter.

Consistent with embodiments of the present disclosure, a digital video communication device is provided. The digital video communication device includes a transmitter providing a spread-spectrum video signal including a predetermined frequency spread value and a frequency ratio, a receiver receiving the spread-spectrum video signal, wherein the receiver comprises a frequency synthesizer, a free-running clock generator configured to generate a free-running clock signal, wherein the free-running clock signal is used as a reference clock signal input to the frequency synthesizer. The receiver further includes a digital control logic circuit configured to separate the frequency ratio from the spread-spectrum video signal, and a line buffer coupled to the digital control logic circuit and the frequency synthesizer, wherein the line buffer adjusts the frequency ratio and sends the adjusted frequency ratio to the frequency synthesizer, wherein the frequency synthesizer combines the free-running clock signal and the adjusted frequency ratio, and outputs a de-spread clock signal.

Further consistent with embodiments of the present disclosure, a method for reducing jitter of a spread-spectrum clock signal received by a digital video receiver is provided. The method includes receiving, by the digital video receiver, the spread-spectrum clock signal, generating, by a free-running clock generator in the digital video receiver, a free-running clock signal, determining an initial frequency ratio at the spread-spectrum clock signal, adjusting, by a line buffer in the digital video receiver, the initial frequency value; receiving, by one or more frequency synthesizers, the free-running clock signal and the adjusted frequency value, and generating, by the one or more frequency synthesizers, an output clock signal having minimized jitter based on the free-running clock signal and the adjusted initial frequency ratio.

DETAILED DESCRIPTION

In the following description, specific details are set forth describing some embodiments consistent with the present disclosure. It will be apparent, however, to one skilled in the art that some embodiments may be practiced without some or all of these specific details. The specific embodiments disclosed herein are meant to be illustrative but not limiting. One skilled in the art may realize other material that, although not specifically described here, is within the scope and the spirit of this disclosure.

Figure 1:
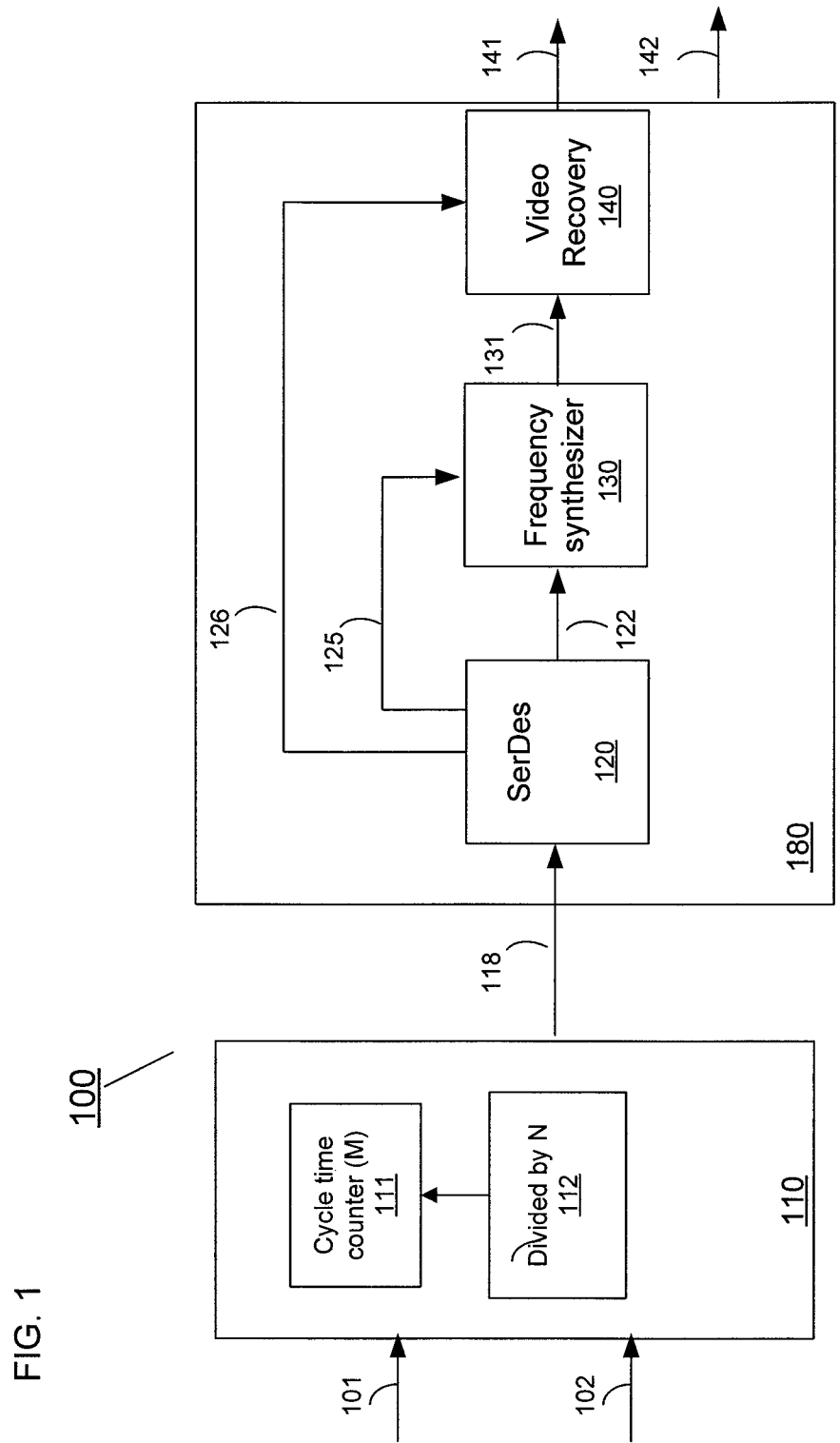
FIG. 1 is a schematic diagram illustrating an audio/video interconnection transceiver including a transmitter and a receiver.

FIG. 1 shows a schematic diagram illustrating an audio/video interconnection transceiver 100. Consistent with some embodiments, audio/video interconnection transceiver 100 may be used as a transceiver that complies with standards such as Digital Visual Interface (DVI), Video Graphics Array (VGA), High-Definition Multimedia Interface (HDMI), Unified Display Interface (UDI), or DisplayPort (DP). As shown in FIG. 1, transceiver 100 includes a transmitter 110, a receiver 180, and perhaps a number of additional repeaters (not shown) or other devices (not shown). Transmitter 110 receives isochronous streams of data such as a set of uncompressed digital video data 101 and digital audio data 102. Transmitter 110 and Receiver 180 are interconnected by one or more uni-directional, high-speed, and low-latency main serial link channels 118 for data transport.

In many stream clock recovery systems, the digital video data 101 and digital audio data 102 being carried across the main serial link channel 118 may not retain the original video pixel clock rate or audio sample clock rate. The main serial link channel 118 is driven by a high speed clock running at a different rate than the original video pixel clock rate or the audio sample clock rate. For example, in accordance with the DisplayPort standard, the main serial link channel clock rate is fixed at either 1.62Gbps or 2.7Gbps, irrespective of the input video or audio clock rates. In accordance with the HDMI standard, the main serial link channel clock runs at the TMDS (Transition Minimized Differential Signaling) clock rate, which corresponds to the video pixel rate, but is independent of the audio sample clock rate. In both HDMI and DisplayPort standards, a fractional relationship time-stamped clock regeneration model can be defined.

In serial communication systems, digital video data is often sent in a stream format without an accompanying clock signal over the serial link. In a clock and data recovery (CDR) process, the digital receiver generates a clock from an approximate frequency reference, and then the data stream is phase-aligned to transitions in the data stream with a device such as a phase-locked loop (PLL). A link or link symbol rate is the number of symbols transferred across the channel per second. The pixel bit rate is the number of data bits passed across the channel. A link or link symbol clock is the clock extracted from the incoming bit stream data, and it is the common clock shared by the transmitter and receiver. In some embodiments a link symbol clock runs at a lower frequency. The link rate is decoupled from the pixel rate, and the pixel rate is regenerated from a link symbol clock using the time stamp values M and N.

The following equations conceptually explain how the stream clock frequency, also referred to as the pixel clock frequency must be derived from the link symbol clock frequency using the Time Stamps, M and N:

$$\text{Stream\_clock\_frequency} = M/N * \text{link\_symbol\_clock\_frequency} \quad (1)$$

where $$N = \text{Reference\_pulse\_period}/\text{link\_symbol\_clock\_period} \quad (2)$$

$$M = \text{Feedback pulse period}/\text{stream\_clock\_period} \quad (3)$$

$$\frac{M}{N} = \frac{\text{stream\_clock\_frequency}}{\text{link\_symbol\_clock\_frequency}} \quad (4)$$

This equation only holds true as long as the Reference pulse period is adjusted constantly to be equal to the Feedback pulse period.

M is a dynamic parameter that is counted based on the incoming data signals, and N is a static parameter that depends on the relevant communication standard of the system. The values M and N are integers representing frequencies in clock recovery.

Returning to FIG. 1, transmitter 110 includes a cycle time counter 111 to count the frequency parameter M from input video clock 101 and a frequency divider 112 drives a "divide by N" operation. The stream data including M and N is carried by main serial link channel 118 to receiver 180.

In receiver 180, a SerDes (Serialization and De-serialization) device 120 takes input data from main serial channel 118 and outputs a link symbol clock signal 122, an M/N ratio 125, and a pixel data signal 126. Link symbol clock signal 122 is used by a frequency synthesizer 130 as its reference clock input. M/N value 125 is calculated and sent to frequency synthesizer 130 as an input signal. Consistent with some embodiments, frequency synthesizer 130 may be a phase-locked loop (PLL) or a delay-locked loop (DLL), or other circuitry for synthesizing frequencies. Frequency synthesizer 130's output signal 131 has a frequency based on equation (1):

$$\text{frequency} = (M/N) * \text{link\_symbol\_clock\_frequency} \quad (5)$$

where link_symbol_clock_frequency could be either 270MHz or 162MHz, for high bit rate and reduced bit rate respectively according to DisplayPort standard 1.1a. Consistent with other embodiments, link_symbol_clock_frequency could be other frequencies appropriate to other standards, such as HDMI or DVI. Video recovery device 140 coverts frequency synthesizer output signal 131 and pixel data signal 126 into video data 141. Receiver 180 processes (not shown) the audio data into audio out 142.

In the ideal case, where the received M and N values are equal to the original M and N values, fractional long-term accuracy of the recovered stream clock is the same as that of the original. However, when the M and N values at receiver 180 are not equal to the original M and N values at the transmitter 110, which is typically caused by bit errors in main serial link channel 118 or imperfect measurement mechanisms at transmitter 110, frequency deviation occurs between transmitter 110 and receiver 180. Over time, the frequency deviation propagates leading to a significant phase offset between transmitter 110 and receiver 180.

Spread-spectrum clocking can be used to provide a more accurate clock rate by dividing the electromagnetic spectrum into narrow frequency bands, and thus providing an improved signal to noise ratio. For example, if the system under test were to radiate all of its energy at one frequency, it would register a large peak at the monitored frequency band. However, spread-spectrum clocking distributes the energy so that it falls into a large number of the frequency bands, without putting enough energy into any one band to exceed the system specified limits. The spread-spectrum clocking process usually down-spreads a small fraction of link symbol clock frequency. For instance, down-spreading of 0.3% or 0.5% of the link symbol clock is commonly used in transmitters that are operating according to the DisplayPort standard.

Returning to FIG. 1, assuming transceiver 100 is operating using spread-spectrum clocking, de-spreading occurs at receiver 180. For de-spreading to work correctly, the transmitting and receiving sequences must be synchronized. This requires the receiver 180 to synchronize its sequence with the transmitter's 110 sequence via a timing search process. In a typical spread spectrum transceiver, the digital video signal transported at the main serial link channel 118 is time stamped by the M and N values generated in transmitter 110.

Although methods exist for recovering pixel data for a whole display line and even an entire display frame, in a transceiver that uses spread-spectrum clocking, the spread nature of the pixel data is problematic for older display devices, particularly those traditional CRT (cathode ray tube) or scaling devices that only have line buffers to scale up or scale down source image to fit into the display device. These older display devices rely on accurate and predictable DE/HSYNC/VSYNC timing to produce a generator lock ("gen-lock"), or to output a scaled image. However, using a link symbol clock in a transceiver using spread-spectrum clocking will inevitably make the period time of DE/HSYNC/VSYNC jitter constantly. For example, a spread-spectrum clock having down-spreading of about 0.2% will cause one line period of 2080 clock cycles (1920 pixels in line data plus 160 clock cycles for blanking) to jitter up to 4 clock cycles (2080*0.2%), if this line period is measured with an accurate single frequency clock. Moreover, jitter in the original main serial link channel 118 will spread to the output pixel clock signal 141 and audio signal 142 as well.

Figure 2:
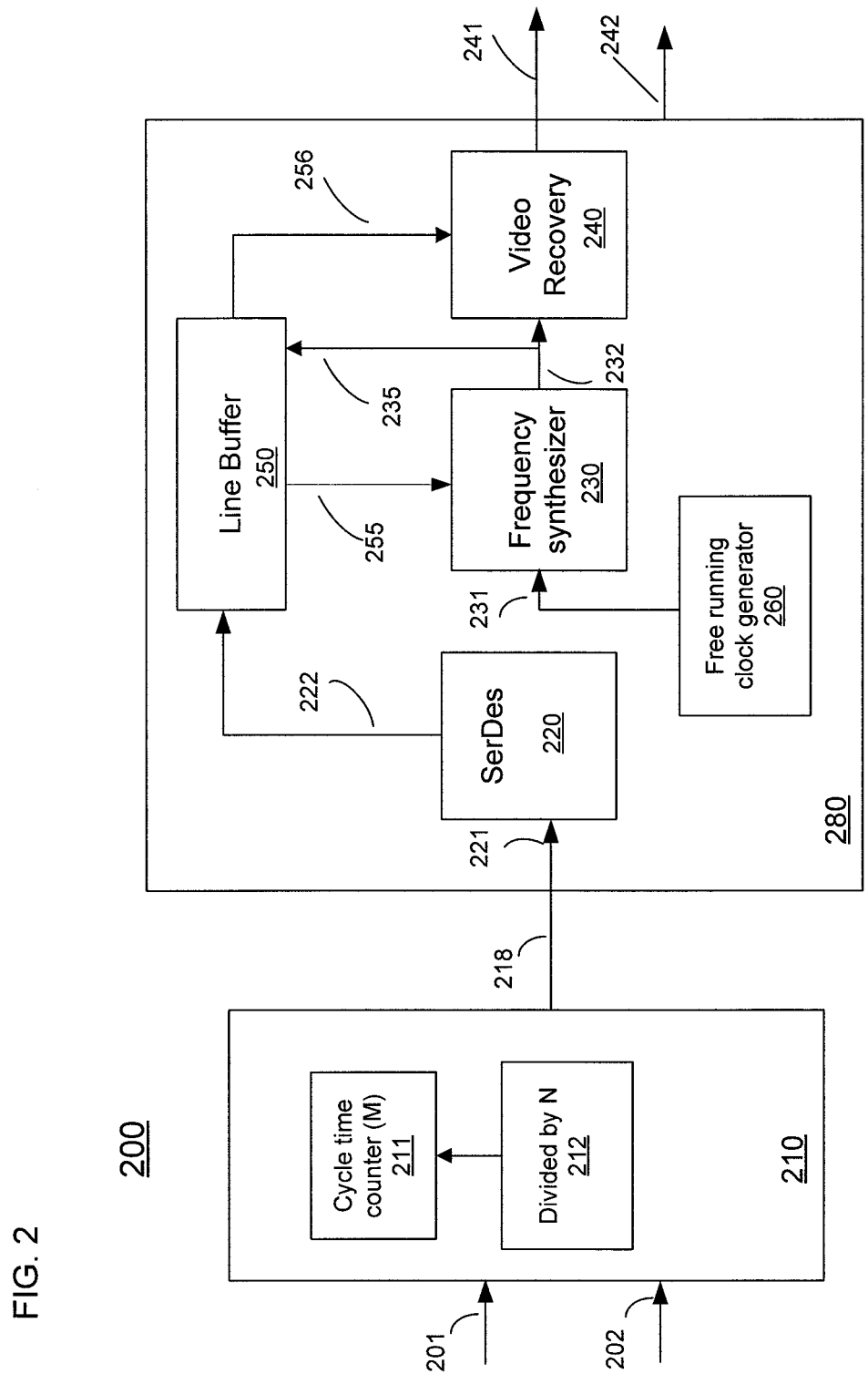
FIG. 2 is a schematic diagram showing a low-jitter audio/video interconnection transmitter and receiver having an independent free-running clock generator.

FIG. 2 shows a low-jitter audio/video interconnection receiver using a de-spreading technique to reduce spread data noise, consistent with some embodiments. Transceiver 200 includes a transmitter 210, a receiver 280, and may further include a number of additional transmitter and receivers as repeaters or other devices (not shown). Consistent with some embodiments, audio/video interconnection transceiver 200 may be used as a transceiver that complies with standards such as Digital Visual Interface (DVI), Video Graphics Array (VGA), High-Definition Multimedia Interface (HDMI), Unified Display Interface (UDI), or DisplayPort (DP). As shown in FIG. 2, transmitter 210 and receiver 280 are interconnected by one or more uni-directional, high-speed, and low-latency main serial link channels 218 designed to transport uncompressed spread digital video data 201 and digital audio data 202. Transmitter 210 includes a cycle time counter 211 to count the frequency parameter M from input video clock 201, and a frequency divider 212 to drive a "divide by N" operation, where M and N are integer numbers defined in Equations (2) and (3) above. The spread-spectrum video input data 221, time stamped with M and N, is transmitted by the main serial link channel 218 receiver 280. Secondary signals such as the audio signals will also be transported via the main serial link channel 218.

Receiver 280 receives spread-spectrum video data 221 from main serial link channel 218, which is input into a SerDes (Serialization and De-serialization) device 220. SerDes device 220 receives a spread spectrum video data input signal 221 from main link channel 218 and outputs spread-spectrum video signal 222 which is stored in a line buffer device 250. Consistent with some embodiments, spread-spectrum video signal 222 includes pixel data, a link symbol clock signal, and an M/N ratio, all included in video data input signal 221 transmitted over main link channel 218. According to some embodiments, the M/N ratio is related to a frequency of the link symbol clock signal and a frequency of the video data input signal 221 (i.e., the input video data streamed from transmitter 210). Line buffer device 250 accommodates any clock discrepancy by providing a buffer read clock 235 for pixel signal 256. Line buffer device 250 first sends an M/N value 255 to a frequency synthesizer 230, which adjusts the frequency and sends a read clock signal 235 back to the line buffer 250. The read clock 235 counts and outputs the pixel video signals 256 to video recovery circuit 240. The process of adjusting the frequency of read clock 235 is continuous. Without a real-time adjusted read clock 235 in line buffer 250, there will be unavoidable underflow or overflow of the frequency-spread video signal in the line buffer 250. Consistent with some embodiments, frequency synthesizer 230 may be a phase-locked-loop (PLL) or a delay-locked loop (DLL), or other circuitry that is capable of synthesizing frequencies.

The frequency synthesizer 230 may include one or more frequency filters (not shown in FIG. 2), according to some embodiments. Frequency synthesizer 230 may also include at least one digital-to-analog converter (not shown in FIG. 2).

A free running clock generator 260 is used to generate a free-running clock signal 231 as the reference clock input for frequency synthesizer 230. Consistent with some embodiments, free-running clock generator may be a crystal clock. By not using the recovered clock from the spread spectrum as the video input data, jitter from the spread-spectrum clock associated with the main serial link channel 218 may be removed from the frequency spread associated with signals transmitted through main serial link channel 218. The M/N value 255 is dynamically adjusted at line buffer 250 to compensate for any clock discrepancies from the de-spread data received by receiver 280 through main serial link channel 218 and the adjusted M/N value 255 is used as an input for frequency synthesizer 230. The structure of line buffer 250 depends on the clock accuracy from M/N value 255, feedback clock signal 235 from frequency synthesizer 230, used as the read clock signal by the line buffer 250, and the frequency synthesizer 230 response times. Depth of line buffer 250 also depends on the M/N ratio, frequency synthesizer 230 clock accuracy, and a frequency synthesizer response time to an M/N value change. The M/N value is usually stable with very little change over time. Therefore, frequency synthesizer 230 is isolated from the spread spectrum noise from the data transmitted over main serial link channel 218. In addition, since the free-running clock signal 231 from the free running clock generator 260 has very little jitter, frequency synthesizer 230 output clock 232 will have very little jitter as well. The dynamically adjusted output clock 232 is also fed back to line buffer 250 as its read clock 235. Output clock 232 from frequency synthesizer 230 is then combined with output pixel data 256 from line buffer 250 at video recovery device 240 to provide a low jitter video signal 241. Although the process of recovering the audio signal from main serial link channel 218 is not shown in FIG. 2, audio data output 242 is recovered similarly to the video signal, and the description is not repeated herein.

Figure 3:
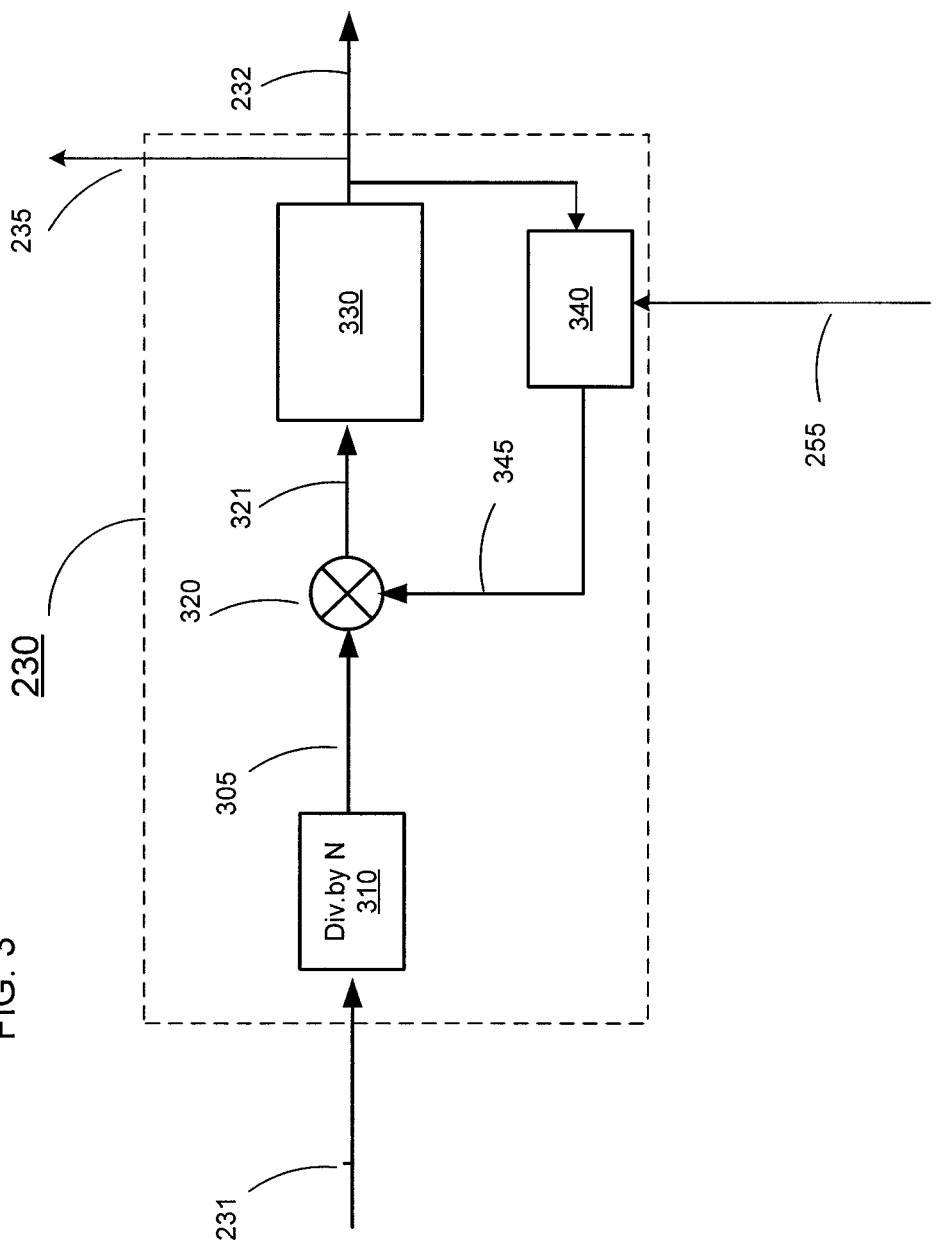
FIG. 3 is a schematic diagram of a frequency synthesizer using a free-running clock signal as its reference clock input, consistent with some embodiments.

FIG. 3 is a schematic diagram of a frequency synthesizer using a free-running clock signal as its reference clock input, consistent with some embodiments. The frequency synthesizer 230 in FIG. 2 includes a frequency synthesizer circuit 330, a multiplier circuit 320, a divide_by_N circuit 310 for a frequency conversion operation on free-running clock 231, and a circuit 340 to receive the M/N value 255 from line buffer 250.

A typical frequency synthesizer receives a standard link clock signal as its input reference clock signal. However, the reference clock signal received by frequency synthesizer 230 is a free-running clock signal 231 generated by the free running clock generator 260 shown in FIG. 2. The free-sunning clock signal 231 is divided by N in circuit 310. The M/N value 255 from line buffer 250 is received by circuit 340. The multiplier 320 combines the divided free-running clock signal 305 with M/N value 345 from circuit 340 into a voltage or current signal, which is sent to a frequency synthesizer circuit 330. One example of a frequency synthesizer circuit is a voltage controlled oscillator, which will generate a clock signal having a clock rate related to the resulting voltage of signal 321. The output clock signal 232 of frequency synthesizer 330 is fed back to line buffer 250 as its read clock 235 in FIG. 2.

Returning to FIG. 2, a self-adaptive de-spreading scheme is thus introduced to filter out spread-spectrum jitter in digital video data stream. Even if the signals transmitted from transmitter 210 have jitter from temperature change or other conditions, receiver 280 tracks the clock changes of transmitter 210. As a result, the average of clock frequency is maintained, and the periodic clock modulations (spread-spectrum) are removed from the data stream. In operation, a de-spreading operation according to some embodiments involves first finding an optimal initial M/N value to match the frequency down spreading, and continuously adjusting the M/N value to maintain the frequency down spreading.

Since most spreading devices use down-spreading, the unspread M/N value from the transmitter 210 cannot be directly input into frequency synthesizer 230. Thus, a corresponding adjusted M/N value 255 must be input to frequency synthesizer 230 to match the video signal modulated in a spread spectrum. For example, a link symbol clock's peak frequency is typically down-spreaded about 0.5% and its average frequency is down-spreaded about 0.25%, thus the M/N value should be about 0.25% lower, or 99.75% of the original M/N value at the transmitter 210.

There are several ways to find this optimal initial M/N value. One exemplary technique starts from by estimating an M/N value, and repeatedly measuring the line buffer entry 222 from a number of different lines. The measured M/N's FIFO status (first-in-first-out status) is compared to decide if the current M/N value is smaller or larger than the estimated value. Consequently, the M/N ratio can be increased or decreased based on this information. The optimization process repeats from the same lines in each frame until line buffer 250 can sustain multiple lines without any data underflow or overflow.

After determining the optimal initial M/N value, the M/N value must be continuously adjusted to produce adjusted M/N value 255. There are a couple of ways to adjust the M/N values. For example, an M/N value for each individual line of may be adjusted carefully to avoid data lost due to line buffer overflow or underflow. Typically the adjusted amount should be small, for example, only a few cycles for a 2080 clock-cycle video sequence should be adjusted to match the free-running clock signal 231 frequency at the frequency synthesizer 230 reference clock input. Otherwise clock jitter will be created again by over changing M/N values.

Another example of continuously adjusting the M/N value is a frame-based adjustment: an M/N value for each frame of spread-spectrum video signal 222 can be adjusted based on the M/N value in one particular line in one frame. The M/N value is checked a few times in the particular line for a few consecutive frames to decide if an accumulated clock jitter is significant to warrant fine tuning of the frame's M/N values. The adjustment should be very small to avoid line buffer overflow or underflow from sudden large changes in the M/N values.

Figure 4:
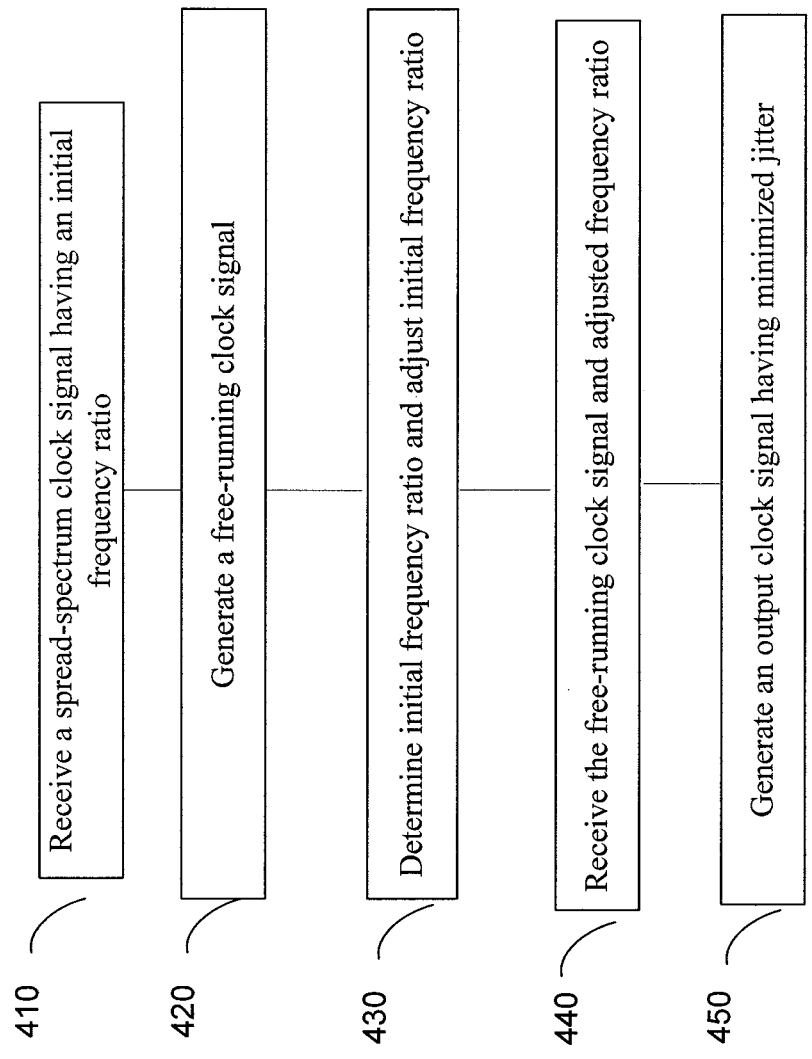
FIG. 4 is a flow chart describing a method for reducing jitter of a spread-spectrum clock signal received by a digital video receiver, consistent with some embodiments.

FIG. 4 is a flow chart describing a method for reducing jitter of a spread-spectrum clock signal received by a digital video receiver, consistent with some embodiments. For the purpose of explanation, the method described in FIG. 4 will be discussed with reference to FIGS. 2 and 3. First, digital video receiver 280 receives a spread-spectrum clock signal having an initial frequency ratio (Step 410). Consistent with some embodiments, a spread-spectrum clock may be included as part of video data input signal 221. A free-running clock signal 231 is generated by free-running clock generator 260 (Step 420). The initial frequency ratio is determined by line buffer 250 and constantly adjusted to produce an adjusted frequency ratio (Step 430). Consistent with some embodiments, the frequency ratio is the M/N ratio discussed previously. The adjusted frequency ratio 255 and the free-running clock signal 231 are input into frequency synthesizer 230 (Step 440). The frequency synthesizer 230 combines the adjusted frequency ratio 255 with the free-running clock 231 and generates an output clock signal 232 having minimized jitter (Step 450).

Consistent with the disclosed embodiments, a de-spreading scheme is provided to filter out spread spectrum noise and/or jitter in a digital video data stream. The scheme is self-adaptive such that any jitter from the transmitter due to temperature change or other adverse conditions is tracked by the receiver. As a result, an average clock frequency is maintained, and the spread spectrum noise is removed from the data stream.

The foregoing description is intended to illustrate but not to limit the scope of the invention, which is defined by the scope of the appended claims. Other embodiments are within the scope of the disclosure.

What is claimed is:

1. A digital video communication device, comprising:
a receiver configured to receive a spread-spectrum (SS) video signal time stamped with a plurality of frequency parameters, wherein the receiver comprises:
a free-running clock generator configured to generate a reference clock signal;
a line buffer coupled to the frequency synthesizer, the line buffer configured to:
store pixel data of the SS video signal;
determine a frequency ratio from the plurality of frequency parameters in the SS video signal,
wherein the frequency ratio relates a stream clock frequency associated with the pixel data to a link symbol clock frequency associated with the SS video signal;
adjust the frequency ratio to avoid overflow and underflow in the line buffer; and
output the adjusted frequency ratio;
a frequency synthesizer configured to generate, based on the reference clock signal and the adjusted frequency ratio, a read clock signal for the line buffer; and
a video recovery device driven by the read clock signal generated by the frequency synthesizer and configured to produce a video output signal by reading the pixel data from the line buffer.

2. The digital video communication device of claim 1, wherein the free-running clock generator comprises a crystal clock.

3. The digital video communication device of claim 1, wherein the frequency synthesizer comprises a phase-locked loop (PLL) circuit.

4. The digital video communication device of claim 1, wherein the receiver further comprises a serialization-deserialization (SerDes) circuit.

5. The digital video communication device of claim 1, wherein the line buffer adjusts the frequency ratio by varying a spread range from 0% to 5%.

6. The digital video communication device of claim 1, wherein the digital video communication device comprises a DisplayPort-compliant device.

7. The digital video communication device of claim 1, wherein the digital video communication device comprises a HDMI-compliant device.

8. A method for reducing jitter associated with a spread-spectrum (SS) video signal received by a digital video receiver, comprising:
receiving, by the digital video receiver, the SS video signal time stamped with a plurality of frequency parameters;
generating, by a free-running clock generator in the digital video receiver, a reference clock signal;
storing, in a line buffer, pixel data of the SS video signal;
determining an initial frequency ratio from the plurality of frequency parameters in the SS video signal, wherein the frequency ratio relates a stream clock frequency associated with the pixel data to a link symbol clock frequency associated with the SS video signal;
adjusting, by the line buffer in the digital video receiver, the initial frequency ratio to avoid overflow and underflow in the line buffer;
generating, by one or more frequency synthesizers and based on the reference clock signal and the adjusted initial frequency ratio, a read clock signal for the line buffer; and
generating, by a video recovery device driven by the read clock signal, a video output signal by reading the pixel data from the line buffer.

9. The method as in claim 8, wherein the digital video receiver comprises a DisplayPort-compliant video receiver.

10. The method as in claim 8, wherein the SS video signal is modulated by down-spreading.

11. The method as in claim 8, wherein the SS video signal is modulated according to a frequency hopping spread.

12. The method as in claim 8, wherein adjusting an initial frequency ratio further comprises identifying an optimal frequency shift as an initial frequency synthesizer input.

13. The method as in claim 12, further comprising adjusting the initial frequency ratio multiple times.

* * * * *